United States Patent
Saedi et al.

(10) Patent No.: US 7,081,712 B2
(45) Date of Patent: Jul. 25, 2006

(54) THERMAL COOLER FOR A LASER DIODE PACKAGE

(75) Inventors: Reza Saedi, Bryn Mawr, PA (US); Arthur Paolella, Jamison, PA (US); James Swanson, Douglassville, PA (US)

(73) Assignee: General Instrument Corporation, Horsham, PA (US)

( * ) Notice: Subject to any disclaimer, the term of this patent is extended or adjusted under 35 U.S.C. 154(b) by 119 days.

(21) Appl. No.: 10/748,082

(22) Filed: Dec. 30, 2003

(65) Prior Publication Data

US 2005/0147139 A1    Jul. 7, 2005

(51) Int. Cl.
*H01J 7/24* (2006.01)
*H01S 3/04* (2006.01)

(52) U.S. Cl. .......................... 315/112; 372/36
(58) Field of Classification Search ................ 315/112, 315/115; 372/6, 34–36
See application file for complete search history.

(56) References Cited

U.S. PATENT DOCUMENTS

| | | | |
|---|---|---|---|
| 5,084,886 A * | 1/1992 | Martin ........................ | 372/36 |
| 5,195,102 A | 3/1993 | McLean et al. ................ | 372/34 |
| 5,329,539 A * | 7/1994 | Pearson et al. ................ | 372/36 |
| 5,704,213 A * | 1/1998 | Smith et al. ................... | 62/3.7 |
| 6,101,201 A | 8/2000 | Hargis et al. ................... | 372/36 |
| 6,205,790 B1 | 3/2001 | Denkin et al. ................ | 62/3.7 |
| 6,522,459 B1 * | 2/2003 | Pease et al. ............. | 359/341.4 |
| 6,837,059 B1 * | 1/2005 | Ueki et al. .................... | 62/3.7 |
| 2002/0121094 A1 * | 9/2002 | VanHoudt ...................... | 62/3.3 |
| 2003/0036303 A1 * | 2/2003 | Fang et al. ................ | 439/487 |
| 2003/0063637 A1 * | 4/2003 | Miguelez et al. ............. | 372/34 |

\* cited by examiner

*Primary Examiner*—Thuy Vinh Tran
(74) *Attorney, Agent, or Firm*—Lawrence T. Cullen

(57) ABSTRACT

A temperature controlled arrangement is provided for housing an optical component such as a laser diode that may be employed in a CATV system. The arrangement includes a package having an enclosure through which a plurality of electrical connections extend. At least one optical component is located in the enclosure and electrically connected to at least one of the electrical connections. A first thermoelectric cooler is also located in the enclosure and in thermal conduction with the optical component. A temperature sensor is located in the enclosure and electrically connected to at least one of the electrical connections. A second thermoelectric cooler, which is located external to the enclosure, is in thermal conduction with the enclosure.

23 Claims, 3 Drawing Sheets

THERMAL COOLER FOR A LASER DIODE PACKAGE

FIELD OF THE INVENTION

The present invention relates generally to laser diodes, and more particularly to a laser diode package that employs thermoelectric cooling.

BACKGROUND OF THE INVENTION

It is well known that the temperature of a laser diode must be closely controlled to operate the laser within precise tolerances for both wavelength and power. A so-called ThermoElectric Cooler (TEC) is often used for this purpose since a TEC can be controlled to either add or extract heat from a laser depending on whether the desired operating temperature is above or below the ambient temperature. Typical temperature controlled packages for laser diodes that use a TEC can control device internal temperatures ranging from about 0–70 degrees Centigrade.

In some cases it is desirable to extend the temperature range over which the laser diode package can be controlled. For example, laser diode packages are often used in communication systems such as CATV systems. In CATV applications, high power laser diodes are often used in the forward transmission path from the headend to the cable subscriber. Other lower power (e.g., 2 mw) laser diodes are often used in the return path from a system node to the headend. The laser diodes are often located in system nodes that contain a variety of other components that generate significant quantities of heat. These components are typically in close proximity to one another to minimize the space occupied by the node. As a result, temperatures inside the node can reach up to about 90 degrees Centigrade. Since conventional laser diode packages are generally specified only up to about 70 degrees Centigrade, it is necessary to physically separate the package from the heat generating components in the node to reduce the temperature experienced by the package. Even in this case the TEC often operates near its maximum temperature differential, which not only reduces the efficiency of the TEC, but could also lead to thermal runaway, since the additional power needed to cool the laser diode may increase rather than decrease the temperature of the laser diode's operating environment, leading to catastrophic failure of the device. At the other temperature extreme, a lightly loaded system in a harsh environment at very low temperature may experience extreme low temperatures of −35 degrees Centigrade or below.

Accordingly, it would be desirable to provide a laser diode package whose temperature can be controlled over a greater range of temperatures.

SUMMARY OF THE INVENTION

In accordance with the present invention, a temperature controlled arrangement is provided for housing an optical component. The arrangement includes a package having an enclosure through which a plurality of electrical connections extend. At least one optical component is located in the enclosure and electrically connected to at least one of the electrical connections. A first thermoelectric cooler is also located in the enclosure and in thermal conduction with the optical component. A temperature sensor is located in the enclosure and electrically connected to at least one of the electrical connections. A second thermoelectric cooler, which is located external to the enclosure, is in thermal conduction with the enclosure.

In accordance with one aspect of the invention, at least one of the plurality of electrical connections electrically connects the first and second thermoelectric coolers.

In accordance with another aspect of the invention, the first and second thermoelectric coolers are electrically connected in series.

In accordance with yet another aspect of the invention, the first and second thermoelectric coolers are electrically connected in parallel.

In accordance with another aspect of the invention, a temperature controller is provided which operatively controls the first and second thermoelectric coolers.

In accordance with another aspect of the invention, the optical component is a laser diode.

In accordance with another aspect of the invention, a thermal conducting element is in contact with an outer surface of the enclosure and a first surface of the second thermoelectric cooler.

In accordance with another aspect of the invention, a heatsink is provided which is in contact with a second surface of the second thermoelectric cooler.

In accordance with another aspect of the invention, temperature controller is a proportional controller.

In accordance with another aspect of the invention, the temperature sensor is a thermistor.

DETAILED DESCRIPTION

The present invention provides a laser diode package that can maintain thermal control over a greater temperature range than a conventional package, thereby allowing the package to operate in an environment that may undergo greater temperature fluctuations. Moreover, the invention may incorporate a conventional, commercially available, thermally controlled laser diode package. As detailed below, a TEC external to the laser diode package is used to enhance the heating and cooling capacity of the TEC that is located within the laser diode package.

Figure 1:
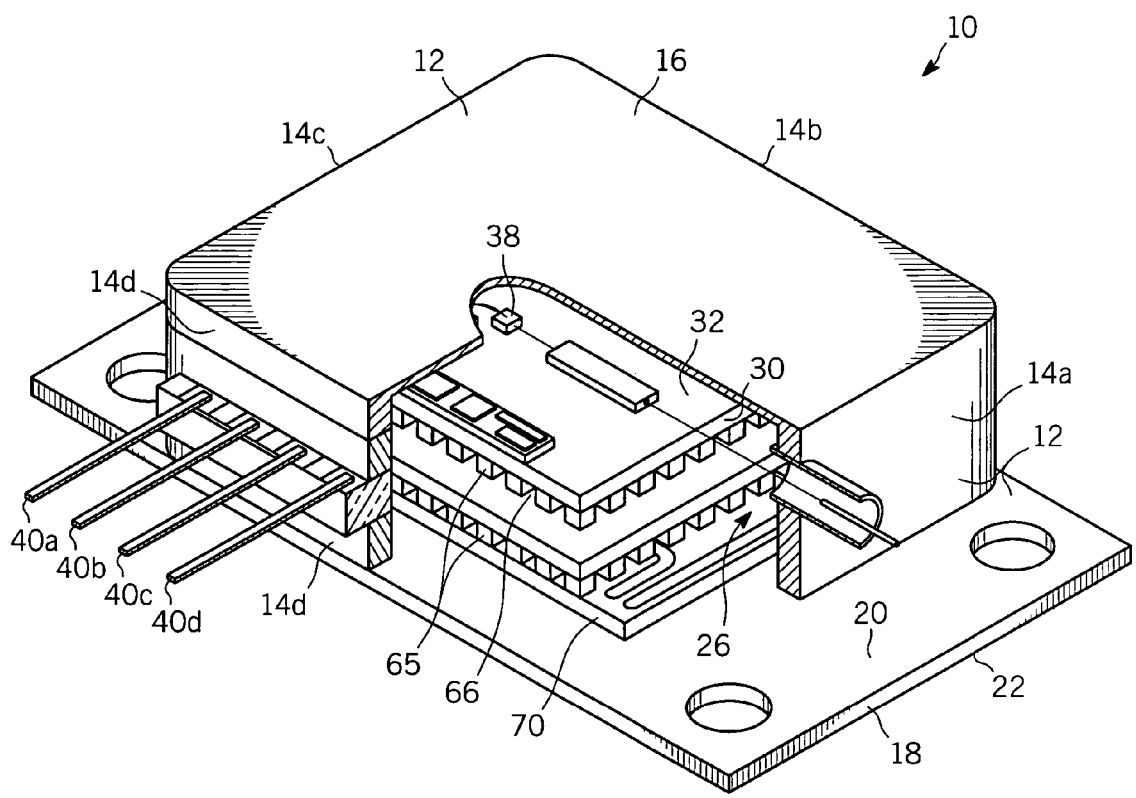
FIG. 1 shows an example of a conventional temperature controlled laser diode package that may be employed in the present invention.

FIG. 1 shows an example of a conventional temperature controlled laser diode package that may be employed in the present invention, which is presented by way of illustration only and not as a limitation on the invention. More generally, the present invention may employ any laser diode package that incorporates a TEC for controlling the laser temperature. As seen in the partially sectioned perspective view of FIG. 1, the package includes a case 12 having sidewalls 14a-14d forming a closed perimeter, a cover 16 and a base 18 having an input surface 20 and an output surface 22. The sidewalls are integrally coupled to each other and to the base input surface 20 to define an interior region 26. A heatsink 30 having a top surface 32 is provided within the interior region 26. A laser diode 38 is coupled to the top surface 32 of the heatsink 30. A thermoelectric cooler 65 has an input surface 66 coupled to the bottom surface of heatsink 30 and a thermoelectric cooler output surface 70 coupled to the base input surface 20. The thermoelectric cooler 65 responds to a control signal received via select ones of the pins 40a, 40b . . . 40g from a temperature controller.

Thermoelectric cooling is an entirely solid state, and therefore very reliable and compact, means of heating and cooling that uses a Peltier device. A Peltier device is fabricated from semiconductor material such as bismuth telluride or lead telluride. The commonly used Peltier materials exhibit very high electrical conductivity and relatively low thermal conductivity, in contrast to normal metals, which have both high electrical and thermal conductivity. In operation the Peltier devices transport electrons from a cold sink to a hot sink in response to an electric field formed across the Peltier device.

Figure 2:
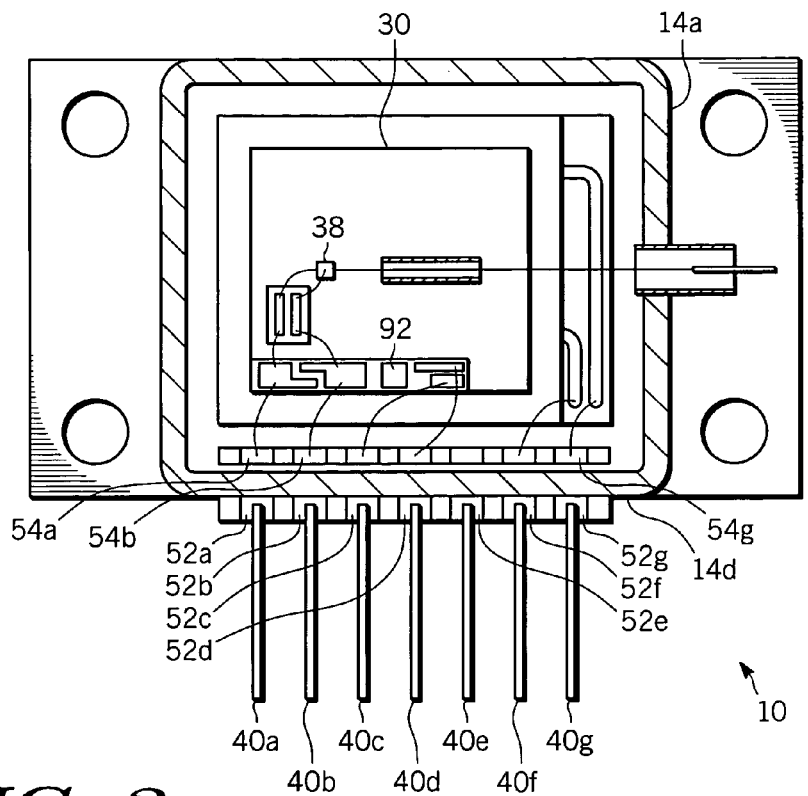
FIG. 2 is a schematic plan view of the laser diode package of FIG. 1 with the lid removed.

FIG. 2 is a schematic plan view of the laser diode package 10 with the lid removed, showing seven pins 40a, 40b . . . 40g attached to respective external pads 52a, 52b . . . 52g. The pads 52a, 52b, . . . 52g extend into the package and provide conductive paths to respective internal pads 54a, 54b 54g. In operation, two of the pins 40a, 40b are connected to a current source (not shown) to deliver drive current to the diode. Two of the leads are used to provide power to the TEC 65 and two of the leads are used for the temperature sensor used to monitor the temperature of the laser diode. The remaining lead is electrically connected to the package to provide a case ground. Also seen in FIG. 2 is a thermistor 92 or other temperature sensor functioning as a temperature sensing means responsive to the temperature of the heatsink 30. The thermistor 92 provides a temperature control signal via two of the pins 40a, 40b . . . 40g to indicate the temperature of the heatsink 30 to an external control circuit.

Figure 3:
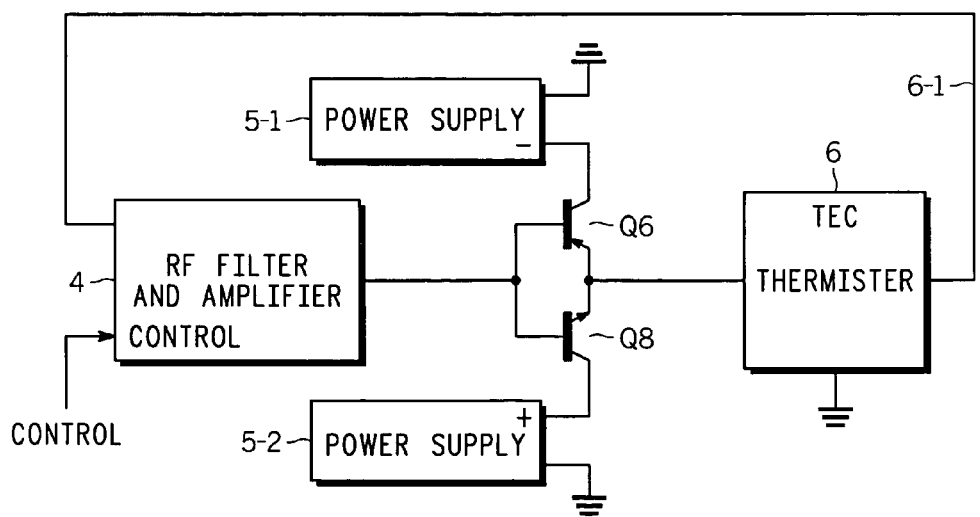
FIG. 3 shows an example of a conventional temperature controller that may be employed to control the temperature of the laser diode located in the package of the present invention.

A number of different controllers have been developed to control the operation of the TEC 65, and thus the cooling/heating of the laser diode 38. Included among these prior art controllers, for example, is a so-called proportional controller, which is illustrated in FIG. 3. The proportional controller uses two power supplies, 5-1 and 5-2, which output voltages of opposite polarities but nominally of equal levels, e.g., .+−0.5 volts, which are supplied to TEC 6 via transistors Q6 and Q8, respectively, under control of amplifier 4. Transistors Q6 and Q8 are controlled by amplifier 4, which is connected to TEC 6 via feedback loop 6-1. The voltage level in the feedback loop changes as the resistance of a thermistor in TEC 6 changes, which indicates the current level of cooling at TEC 6. That is, the TEC thermistor is connected to a conventional balanced bridge circuit in the RF filter and amplifier circuit. The amplifier circuit amplifies an error signal that is developed across the bridge when the bridge is not balanced, and uses the amplified signal to "turn on" either transistor Q6 or Q8 a certain amount to respectively increase the cooling or heating that TEC 6 is supplying to the laser (not shown). Additional details concerning this and other controllers that may be used to control the TEC 65 are shown, for example, in U.S. Pat. No. 6,205,790.

Figure 4:
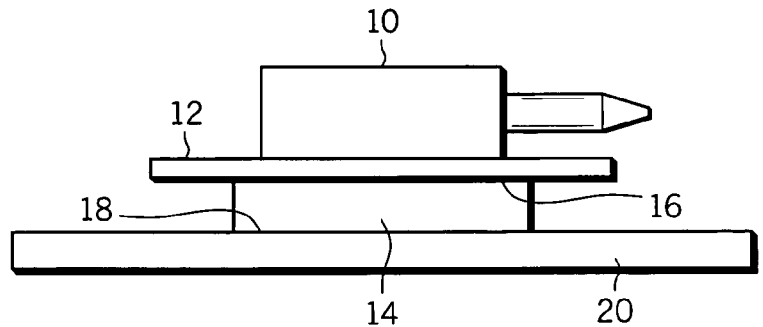
FIG. 4 shows one embodiment of the laser diode package arrangement constructed in accordance with the present invention.

In accordance with the present invention, a laser diode package such as depicted in FIG. 1 employs an external TEC to enhance the thermal control of the device and increase the ambient temperature range over which it can operate. That is, the temperature of the laser diode is controlled by a first TEC internal to the package and a second TEC that is external to the package. FIG. 4 shows one embodiment of the arrangement, which includes a laser diode package 10 in contact with a thermal conducting element 12 such as a metallic plate. An external TEC 14 has an input surface 16 in contact with the thermal conducting element 12 and an output surface 18 in contact with a heatsink 20. The external TEC 14 should have sufficient capacity to handle the thermal load of the laser diode package 10. In some embodiments of the invention the thermal conductive element may be eliminated so that the laser diode package 10 is in direct contact with the TEC 14.

Figure 5:
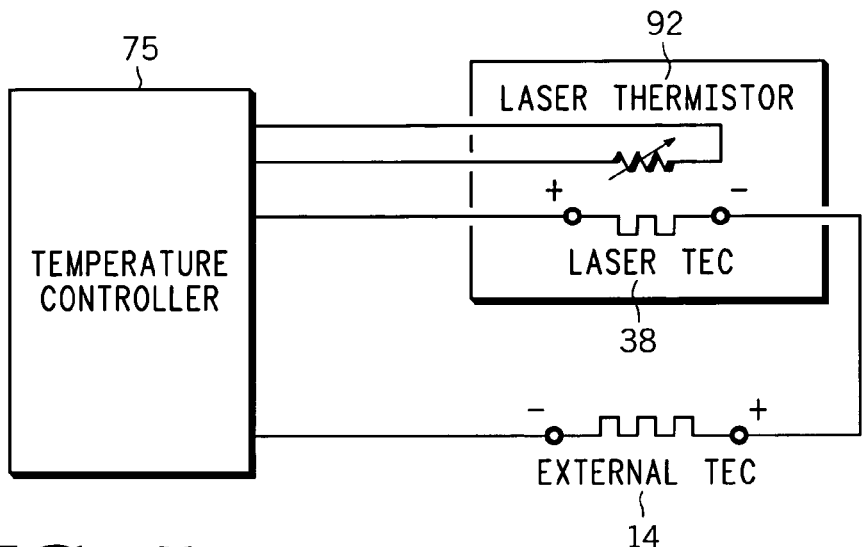
FIG. 5 is a schematic diagram of the laser diode package arrangement, including the controller, with the internal and external thermoelectric coolers connected in series.

The external TEC 14 may be controlled by its own dedicated temperature controller. In this case the arrangement requires two controllers, one to control the internal TEC and one to control the external TEC 14. Alternatively, in one embodiment of the invention, which is schematically illustrated in FIG. 5, the first TEC internal to the package 10 and the second external TEC 14 are controlled by a single controller 75. The use of a single controller to control both TECs is advantageous not only because it provides a less expensive and more efficient arrangement, but also because the control circuit will be more stable since it employs only one control loop instead of two control loops, which could cause instabilities.

Figure 6:
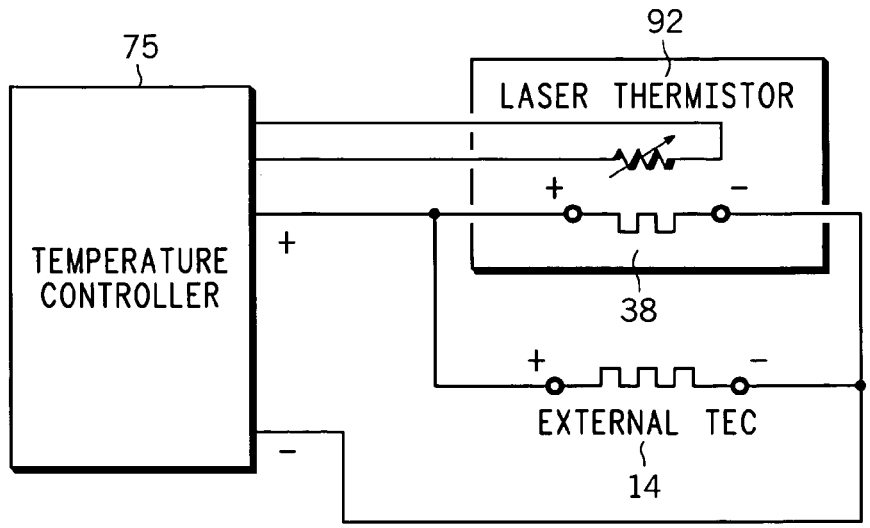
FIG. 6 is a schematic diagram of the laser diode package arrangement, with the internal and external thermoelectric coolers connected in parallel to the temperature controller.

The internal and external TECs may be connected in series or parallel with the temperature controller 75. In FIG. 5, the TECs are shown connected in series and in FIG. 6 they are shown connected in parallel. In either case, the thermistor located in the laser diode package is used to measure the temperature that is used by the controller. The controller provides sufficient current to maintain the resistance of the thermistor at a constant value, which corresponds to a constant temperature at which the laser diode is to be maintained. Since in FIG. 5 the internal and external TECs are driven by the same current (and in FIG. 6 they are driven by the same voltage), the temperature of the package 10, the thermally conducting element 12, and the external TEC 14 are intermediate to the temperature of the laser diode itself and the heatsink 20. The external TEC 14 is configured so that the temperature of the laser diode package is maintained within a safe operating range, while the temperature of the heatsink 20 may vary widely.

The use of an external TEC in the aforementioned manner to enhance the heating and cooling capacity of the TEC located within the laser diode package substantially increases the ambient temperature range over which the temperature of the laser diode can be controlled. Moreover, because of the increased heating and cooling capacity of the arrangement, the internal and external TECs are less likely to operate near their respective maximum temperature differentials, increasing their efficiency and reducing the likelihood of thermal runaway.

The invention claimed is:

1. A temperature controlled arrangement for housing an optical component, comprising:
   a package having an enclosure through which a plurality of electrical connections extend;
   at least one optical component located in the enclosure and electrically connected to at least one of the electrical connections;

a first thermoelectric cooler located in the enclosure and in thermal conduction with the optical component;
a temperature sensor located in the enclosure and electrically connected to at least one of the electrical connections; and
a second thermoelectric cooler located external to the enclosure and in thermal conduction with the enclosure,
wherein at least one of the plurality of electrical connections electrically connects the first and second thermoelectric coolers and the first and second thermoelectric coolers are electrically connected in series.

2. The arrangement of claim 1 further comprising a temperature controller operatively controlling the first and second thermoelectric coolers.

3. The arrangement of claim 2 wherein said temperature controller is a proportional controller.

4. The arrangement of claim 1 wherein the optical component is a laser diode.

5. The arrangement of claim 1 further comprising a heatsink in contact with a second surface of the second thermoelectric cooler.

6. The arrangement of claim 1 wherein said temperature sensor is a thermistor.

7. The arrangement of claim 1 further comprising a thermal conducting element in contact wit an outer surface of the enclosure and a first surface of the second thermoelectric cooler.

8. A temperature controlled arrangement for housing an optical component, comprising:
a package having an enclosure through which a plurality of electrical connections extend;
at least one optical component located in the enclosure and electrically connected to at least one of the electrical connections;
a first thermoelectric cooler located in the enclosure and in thermal conduction with the optical component;
a temperature sensor located in the enclosure and electrically connected to at least one of the electrical connections;
a second thermoelectric cooler located external to the enclosure and in thermal conduction with the enclosure,
wherein at least one of the plurality of electrical connections electrically connects the first and second thermoelectric coolers and the first and second thermoelectric coolers are electrically connected in parallel.

9. The arrangement of claim 8 further comprising a temperature controller operatively controlling the first and second thermoelectric coolers.

10. The arrangement of claim 9 wherein said temperature controller is a proportional controller.

11. The arrangement of claim 8 wherein the optical component is a laser diode.

12. The arrangement of claim 8 further comprising a thermal conducting element in contact with an outer surface of the enclosure and a first surface of the second thermoelectric cooler.

13. The arrangement of claim 8 further comprising a heatsink in contact with a second surface of the second thermoelectric cooler.

14. The arrangement of claim 8 wherein said temperature sensor is a thermistor.

15. A temperature controlled arrangement for housing an optical component, comprising:
a package having an enclosure;
at least one optical component located in the enclosure;
a first thermoelectric cooler located in the enclosure and in thermal conduction with the optical component;
a temperature sensor located in the enclosure;
a second thermoelectric cooler located external to the enclosure and in thermal conduction with the enclosure; and
a thermal conducting element in contact with an outer surface of the enclosure and a first surface of the second thermoelectric cooler,
wherein the first and second thermoelectric coolers are electrically connected in one of a series circuit or a parallel circuit.

16. The arrangement of claim 15 wherein at least one of the plurality of electrical connections electrically connects the first and second thermoelectric coolers.

17. The arrangement of claim 16 further comprising a temperature controller operatively controlling the first and second thermoelectric coolers.

18. The arrangement of claim 17 wherein said temperature controller is a proportional controller.

19. The arrangement of claim 15 further comprising a temperature controller operatively controlling the first and second thermoelectric coolers.

20. The arrangement of claim 19 wherein said temperature controller is a proportional controller.

21. The arrangement of claim 15 wherein the optical component is a laser diode.

22. The arrangement of claim 15 further comprising a heatsink in contact with a second surface of the second thermoelectric cooler.

23. The arrangement of claim 15 wherein said temperature sensor is a thermistor.

* * * * *